United States Patent
Shim

(10) Patent No.: US 6,941,122 B2
(45) Date of Patent: Sep. 6, 2005

(54) CIRCUIT FOR COMPENSATING TEMPERATURE OF AUTOMATIC GAIN CONTROL CIRCUIT

(75) Inventor: Ju-Heon Shim, Kyungki-Do (KR)

(73) Assignee: LG Electronics Inc., Seoul (KR)

( * ) Notice: Subject to any disclaimer, the term of this patent is extended or adjusted under 35 U.S.C. 154(b) by 430 days.

(21) Appl. No.: 10/164,610

(22) Filed: Jun. 10, 2002

(65) Prior Publication Data

US 2002/0187766 A1 Dec. 12, 2002

(30) Foreign Application Priority Data

Jun. 11, 2001 (KR) .......................................... 2001-32621

(51) Int. Cl.[7] .............................. H04B 1/06; H03G 3/10
(52) U.S. Cl. .............................. 455/232.1; 455/240.1; 455/249.1; 455/127.2; 330/289; 330/278; 330/284
(58) Field of Search .......................... 455/232.1–253.2, 455/127.1–127.4, 114.2–114.4; 330/256, 266, 272, 278, 284, 287, 289

(56) References Cited

U.S. PATENT DOCUMENTS

| | | | | |
|---|---|---|---|---|
| 4,401,898 A | * | 8/1983 | Sommerer | 327/513 |
| 5,177,453 A | * | 1/1993 | Russell et al. | 330/284 |
| 5,687,195 A | * | 11/1997 | Hwang et al. | 375/345 |
| 5,873,029 A | * | 2/1999 | Grondahl et al. | 455/126 |
| 5,907,798 A | * | 5/1999 | Abramsky et al. | 455/249.1 |
| 6,359,498 B1 | * | 3/2002 | Kurihara et al. | 327/513 |
| 6,472,949 B1 | * | 10/2002 | Yamazaki et al. | 333/81 R |
| 6,553,213 B1 | * | 4/2003 | Kikuchi | 330/129 |

FOREIGN PATENT DOCUMENTS

EP 000570897 A2 * 11/1993 ............ H03G/1/04

* cited by examiner

*Primary Examiner*—Duc M. Nguyen
(74) *Attorney, Agent, or Firm*—Fleshner & Kim, LLP

(57) ABSTRACT

A circuit for compensating temperature of an automatic gain control (AGC) circuit includes a low noise amplifier (LNA) for amplifying a received radio frequency (RF) signal, an attenuation control unit for generating an attenuation control signal by sensing the amplified RF signal, and a PIN diode attenuator for attenuating the RF signal inputted to the LNA by driving the PIN diode with an attenuation control signal. A temperature compensation unit for compensating an attenuation change amount of the PIN diode caused by the change of temperature compensates the voltage change between the PIN diodes by using an additional PIN diode having identical characteristic of temperature as the PIN diode of the PIN diode attenuator.

18 Claims, 3 Drawing Sheets

CIRCUIT FOR COMPENSATING TEMPERATURE OF AUTOMATIC GAIN CONTROL CIRCUIT

BACKGROUND OF THE INVENTION

1. Field of the Invention

The present invention relates to an automatic gain control (AGC) circuit of a mobile communication terminal, and particularly, relates to a circuit for compensating temperature of an AGC circuit.

2. Background of the Related Art

Generally, in a mobile communication system, a terminal and a base station perform gain control to prevent a receiving channel from being saturated when a receiving signal is strongly applied. There are many ways of designing a circuit for gain control. For example, there is a method of using an AGC amplifier to perform gain control as a low noise amplifier (LNA) after a duplexer. Further, there are methods of using the AGC amplifier after the LNA and of using an attenuator at the front end of the LNA.

FIG. 1 shows a related art AGC circuit using a PIN attenuator. The related art AGC circuit includes a duplexer 10 for separating radio frequency (RF) signals received through an antenna, and a PIN diode attenuator 20 for attenuating the RF signals, which were separated by the duplexer 10. Additionally, the circuit includes a LNA 30 for performing low noise amplification on the output signal of the PIN diode attenuator 20 and an attenuation control unit 40 for outputting an attenuation control signal to the PIN diode attenuator 20 by sensing the RF signal RFout, which was amplified and outputted by the LNA 30.

The PIN diode attenuator 20 includes capacitors C1 and C2, which are serially connected between the duplexer 10 and LNA 30, and a resistor R1 and a PIN diode PIN1, which are serially connected between an output terminal of an operational (OP) amplifier 42 and the capacitor C2. The PIN diode attenuator 20 further includes a PIN diode PIN2, resistor R2, and capacitor C3, which are connected between the capacitor C1 and a ground in parallel. An inductor (L2) bypasses the output signal of the second PIN diode PIN2 to the ground.

The attenuation control unit 40 includes a gain control unit 41 which generates a gain control signal AGC_cont by sensing the RF signal RFout amplified by the LNA 30, and an operational (OP) amplifier 42 for outputting the attenuation control signal by amplifying the gain control signal AGC_cont outputted from the gain control unit 41. Subsequently, the inductor(L1) blocks an alternating current component that flows into the OP amp 42.

The operation of the related art AGC circuit with the above composition is that the duplexer 10 receives a radio frequency (RF) signal through an antenna and outputs the received RF signal to the LNA 30 through the capacitors C1 and C2. The LNA 30 amplifies the RF signal outputted from the duplexer 10 according to the gain control signal AGC_cont. Because the RF signal is received through a multiplex passage, the received RF signal becomes either higher or lower due to the signal overlapping of the multiplex passages. If an RF signal having a non-uniform receiving level is amplified in the LNA 30, the level of the received RF signal especially needs to be attenuated properly. When the level of change of the RF signal is higher, the effect of the possible error is larger.

The gain control unit 41 of the attenuation control unit 40 compares the level of the RF signal RFout, which is outputted from the LNA 30, with a reference level and outputs the gain control signal AGC_cont to the OP amplifier 42. The OP amplifier 42 then outputs an attenuation control signal according to the gain control signal AGC_cont to uniformly maintain the level of the RF signal, which is inputted to the LNA 30.

Further, the PIN diode attenuator 20 attenuates the RF signal, which is later inputted to the LNA 30, according to the attenuation control signal that was outputted from the attenuation control unit 40. The attenuation amount of the RF signal is determined by the voltage level of the attenuation control signal, which is inputted to the PIN diodes PIN1 and PIN2, as shown in FIG. 2A. Hence, when the voltage level of the attenuation control signal, which is outputted from the OP amplifier 42 by the gain control signal AGC_cont is increased, the amount of the current, which flows to the PIN diodes PIN1 and PIN2, is also increased. When the amount of the current is increased, the internal resistance of the PIN diodes PIN1 and PIN2 is decreased. Therefore, the attenuation amount of the RF signal is increased.

If the gain control signal AGC_cont is changed by 1.6V, an attenuation of 12.5 dB is generated. This amount means that 0.7 dB of attenuation is generated per 1 mV. In addition, the extent of the attenuation amount can be adjusted by changing the value of resistors R1 and R2. The attenuation of the related art is designed to be as much as the gain of the LNA 30 when the maximum gain control signal AGC_cont is maximized.

When temperature of the circumstance is changed, the internal resistance of the PIN diode of the attenuator is changed accordingly. Namely, the resistance of the PIN diodes PIN1 and PIN2 is increased at high temperatures and decreased at low temperatures. As a result, when the temperature is changed, the voltage between the PIN diodes PIN1 and PIN2 is changed; that is, the amount of current is changed. As shown in FIG. 2B, the voltage between node A and ground is changed at an approximate rate of 5.2 mV/° C. Thus, the capacitor C3 has a function of removing a DC component.

Therefore, when temperature changes from +60° C. to −30° C., the voltage between node A and ground changes 0.47V due to the change in current flowing in the PIN diodes PIN1 and PIN2, and the current value is converted as attenuation amount of 3.2 dB. Specifically, 3.2 dB of attenuation difference can be generated between the maximum and minimum temperatures.

As described above, the related art AGC circuit has various problems. For example, because internal resistance of the PIN diode is changed by the surrounding temperature of the AGC circuit, the attenuation amount of the PIN diode attenuator is changed. Accordingly, gain control of the RF signal cannot be achieved properly.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention to provide a circuit for compensating temperature of an automatic gain control (AGC) circuit in a mobile communication system, where the circuit is capable of compensating an attenuation change amount of the PIN diode in an AGC circuit with a PIN diode.

Another object of the present invention is to provide a PIN diode attenuator having a temperature compensation function that can compensate characteristic changes of the PIN diode according to a temperature change.

In order to achieve at least the above objects in whole or in parts, there is provided, a circuit for compensating temperature of an AGC circuit, including a low noise amplifier (LNA) for amplifying a radio frequency (RF) signal and an attenuation control unit for generating an attenuation control signal by sensing the amplified RF signal. The circuit further includes a PIN diode attenuator for attenuating the RF signal inputted to the LNA by driving the PIN diode by an attenuation control signal, and a temperature compensation unit for compensating the attenuation change of the PIN diode according to a change of temperature.

In order to achieve at least the above objects in whole or in parts, there is provided, a PIN diode attenuator having a function of temperature compensation is provided. In an AGC circuit, a LNA for amplifying a RF signal divided in a duplexer and an attenuator for generating an attenuation control signal by sensing the RF signal outputted from the LNA are included. Preferably, a first resistor for receiving the attenuation control signal and a first PIN diode in which a cathode is connected to the first resistor and anode is connected with an input terminal of the LNA in parallel. A second PIN diode in which the cathode is connected to the input second PIN diode terminal of the LNA, a second resistor connected between the anode of the second PIN diode and a first node are also included. The attenuator farther includes a third capacitor connected between the first node and ground, and a temperature compensation unit for compensating voltage changes of the first and second PIN diodes caused by temperature changes.

Additional advantages, objects, and features of the invention will be set forth in part in the description which follows and in part will become apparent to those having ordinary skill in the at upon examination of the following or may be learned from practice of the invention. The objects and advantages of the invention may be realized and attained as particularly pointed out in the appended claims.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the present invention.

DETAILED DESCRIPTION OF PREFERRED EMBODIMENTS

Figure 1:
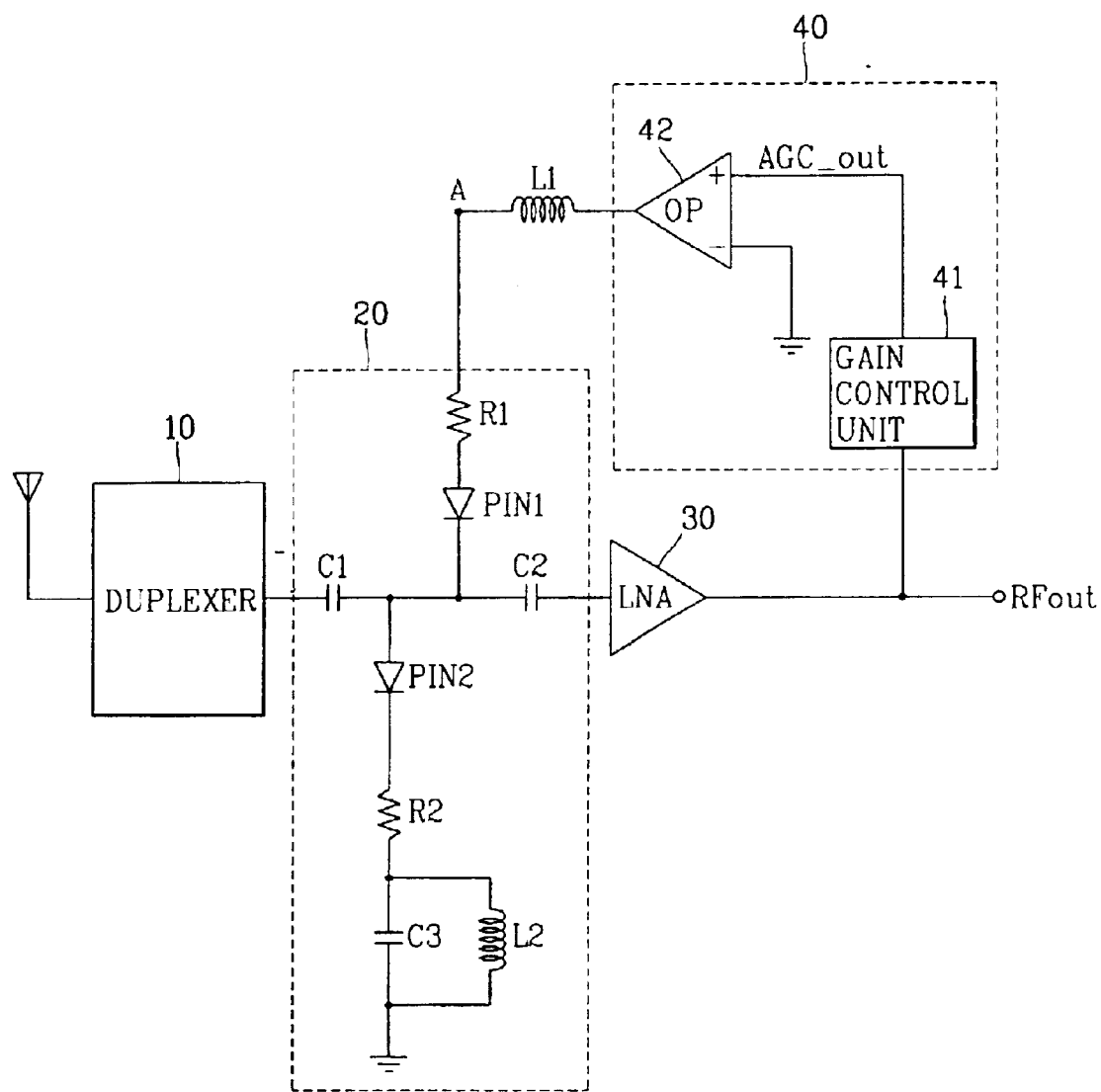
FIG. 1 is a schematic diagram illustrating a composition of a related art the AGC circuit.
Figure 2A:
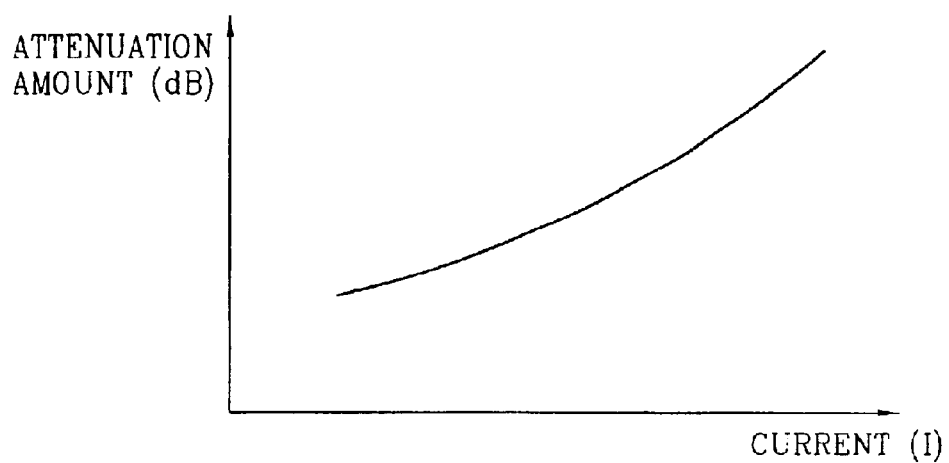
FIG. 2A is a graph illustrating the characteristic corresponding to a current versus attenuation amount of the PIN diode of the AGC circuit of FIG. 1.
Figure 2B:
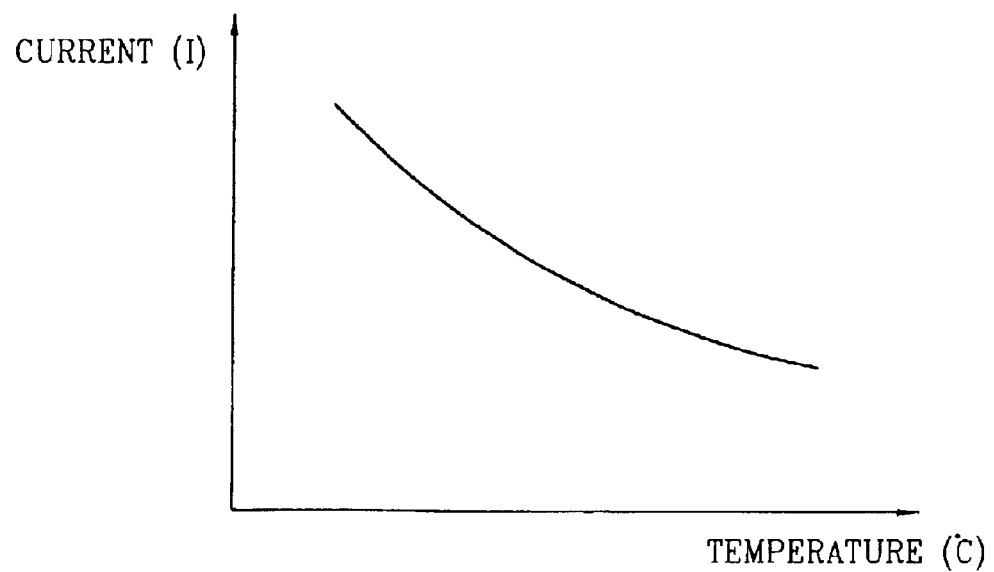
FIG. 2B is a graph illustrating the characteristic corresponding to a temperature versus current amount of the PIN diode of the AGC circuit of FIG. 1.
Figure 3:
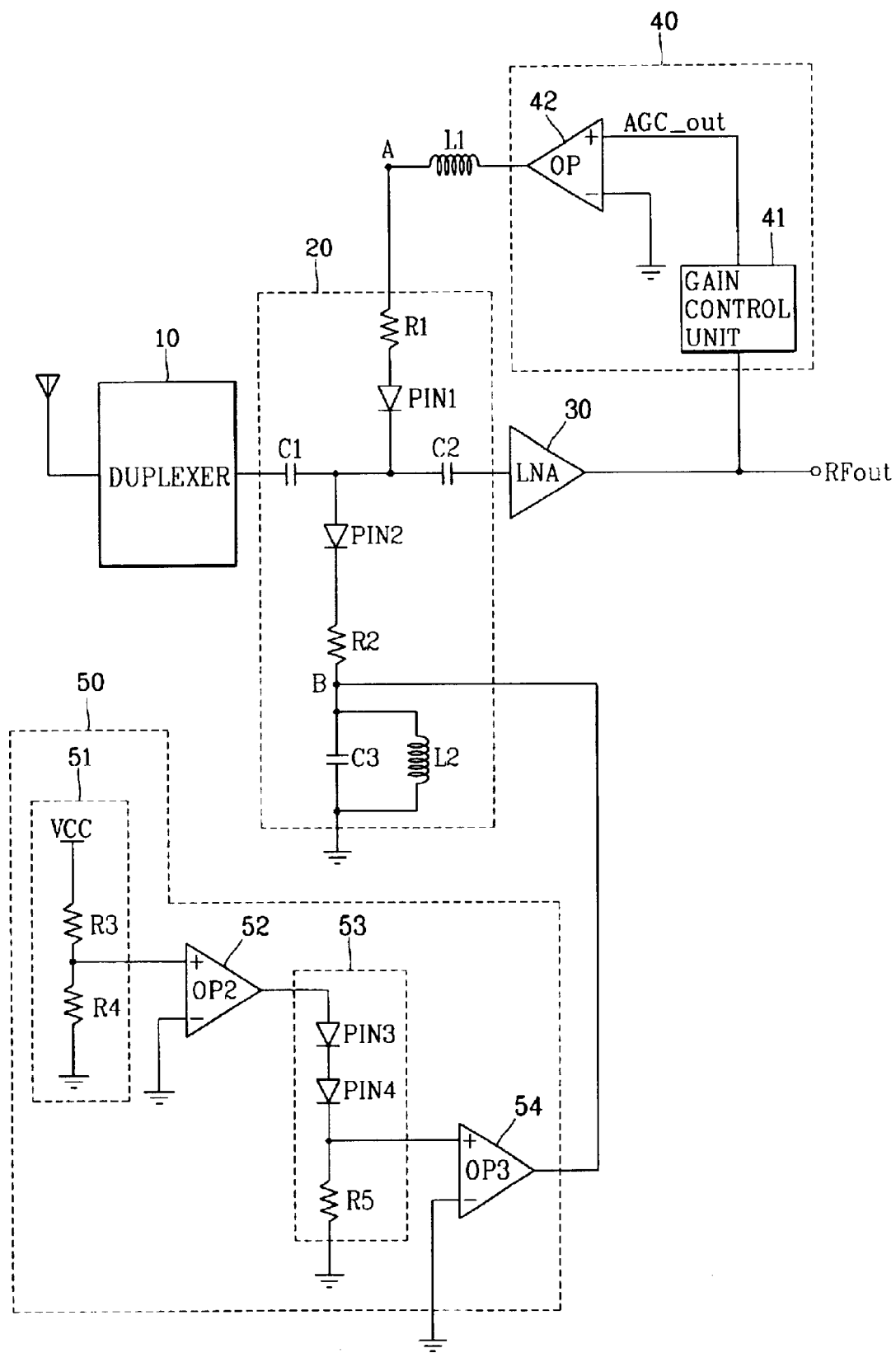
FIG. 3 is a schematic diagram illustrating the composition of an AGC circuit in accordance with a preferred embodiment of the present invention.

Reference will now be made to the preferred embodiments of the present invention, examples of which are illustrated in the accompanying drawings. As shown in FIG. 3, the circuit for compensating temperature in the AGC circuit in accordance with the preferred embodiment includes a temperature compensation unit 50, in addition to the AGC circuit of in FIG. 1.

The temperature compensation unit 50 provides a voltage to node B when the voltage difference between the PIN diodes PIN1 and PIN2 is varied by a surrounding temperature change. The compensation voltage to node B is to compensate for the change of attenuation of the PIN diode attenuator 20, caused by temperature change. The temperature compensation unit 50 preferably includes a first voltage divider 51 for dividing a power supply voltage VCC at a predetermined resistance ratio and an OP amplifier 52 for amplifying the divided voltage of the first voltage divider 51. The temperature compensation unit 50 also preferably includes a second voltage divider 53 for dividing the output voltage of the OP amplifier 52 at a predetermined resistance ratio and an OP amplifier 54 for amplifying the divided voltage of the second voltage divider 53.

The first voltage divider 51 is preferably composed of resistors R3 and R4 which are serially connected between a power supply voltage VCC and ground. The second voltage divider 53 is preferably composed of third and fourth PIN diodes PIN3 and PIN4, which ate connected between the outputted and ground of the OP amplifier 52 and a resistor R5. The operation of the circuit for compensating temperature in the AGC circuit in accordance with the preferred embodiment having the above composition will be described with reference to the accompanied drawings as follows.

The RF signal, which was received through an antenna and duplexer 10, is amplified in the low noise amplifier (LNA)30, and the PIN diode attenuator 20 attenuates the RF signal, which is inputted to the LNA 30 according to the attenuation control signal. Under this condition, when temperature is changed, an amount of the current flowing into the PIN diodes PIN1 and PIN2 is also changed. Specifically, voltage between the PIN diodes PIN1 and PIN2 is changed at an approximate rate of 5.2V/° C.

Therefore, in the preferred embodiment, the voltage between node A and node B is uniformly maintained by changing the potential of node B based on the changed amount caused by temperature variation between the PIN diodes PIN1 and PIN2. Namely, the voltage change between the PIN diodes PIN1 and PIN2 is compensated according to a temperature change by using the PIN diodes PIN3 and PIN4, which have an identical temperature characteristic as PIN diodes PIN1 and PIN2 of the PIN diode attenuator 20.

As shown in FIG. 3, the first voltage divider 51 of the temperature compensation unit 50 divides the power supply voltage VCC using the resistors R3 and R4 and the first divided voltage is amplified in the OP amplifier 52 and inputted to the second voltage divider 53 The second voltage divider 53 divides the input voltage of the first divider by the internal resistance and resistor R5 of the third and fourth PIN diodes PIN3 and PIN4 again and outputs the voltage to the OP amplifier 54. The OP amplifier 54 amplifies the second divided voltage, which was outputted from the second divider, and applies th& divided voltage to node B.

Thus, when temperature changes, the internal resistance of the PIN diodes PIN1 and PIN2 is also changed. The internal resistance of the PIN diodes PIN3 and PIN4, which have an identical characteristic of temperature, is also changed. Consequently, the voltage identical to the voltage difference between the PIN diodes PIN1 and PIN2 is applied from the OP amplifier 54 to the node B. As a result, the change of voltage extent of the PIN diodes PIN1 and PIN2 is compensated by the applied voltage to node B, and no voltage is generated between node A and node B.

Consequently, as the change amount of the attenuation caused by the temperature change is maintained uniformly, the PIN diode attenuator 20 can attenuate the RF signal stably. Moreover the sensitivity and operation embodied in the AGC circuit, regardless of the temperature change, can be greatly enhanced by compensating the changed amount of the attenuation of the PIN diode attenuator based on temperature change.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to covet the structures described herein as performing the recited function and not only structural equivalents but also equivalent structures.

What is claimed is:

1. A circuit for compensating temperature of an automatic gain control (AGC) circuit, comprising:
    a low noise amplifier (LNA) configured to amplify a radio frequency (RF) signal;
    an attenuation control unit configured to generate an attenuation control signal by sensing the amplified RF signal;
    a PIN diode attenuator configured to attenuate the RF signal inputted to the LNA by driving a first PIN diode with the attenuation control signal; and
    a temperature compensation unit configured to compensate a change in an amount of attenuation of the PIN diode caused by a temperature change,
    wherein the temperature compensation unit comprises:
    a first voltage divider to divide a power supply voltage;
    a first operational (OP) amplifier to amplify the divided voltage of the first voltage divider;
    a second voltage divider to divide an output voltage of the first OP amplifier with a second PIN diode having a same characteristic as the first PIN diode; and
    a second OP amplifier to amplify an output of the second voltage divider and output the amplified voltage to the PIN diode attenuator.

2. The circuit of claim 1, wherein the second voltage divider comprises two PIN diodes and a resistor coupled in series.

3. A PIN diode attenuator having a temperature compensation unit, in an automatic gain control (AGC) circuit including a low noise amplifier (LNA) for amplifying a radio frequency (RF) signal distributed from a duplexer and an attenuator for generating an attenuation control signal by sensing the RF signal amplified in LNA, comprising:
    a first resistor coupled to receive the attenuation control signal;
    a first PIN diode in which a cathode is coupled to the first resistor and an anode is coupled with an input terminal of the LNA in parallel;
    a second PIN diode in which a cathode is coupled to the input terminal of the LNA in parallel;
    a second resistor coupled between a first node and the anode of the second PIN diode;
    a capacitor which is coupled between the first node and a ground; and
    a temperature compensation unit is configured to compensate a voltage change between the first and second PIN diodes caused by a temperature change,
    wherein the temperature compensation unit comprises:
    a first voltage divider coupled to divide a power supply voltage;
    a first operational (OP) amplifier coupled to amplify the divided voltage of the first voltage divider;
    a second voltage divider including third and fourth PIN diodes having a same function as the first and second PIN diodes, and a resistor to divide an output voltage of the first OP amplifier; and
    a second OP amplifier coupled to amplify an output voltage of the second voltage divider and output the amplified voltage to the first node.

4. The attenuator of claim 3, wherein the temperature compensation unit applies a same voltage as in the voltage change of the first and second PIN diodes according to a temperature change to the first node.

5. A temperature control unit, comprising:
    a first voltage divider configured to divide a power supply voltage;
    a first operational (OP) amplifier coupled to amplify the divided voltage of the voltage divider;
    a second voltage divider having first and second PIN diodes and a resistor configured to divide an output voltage of the first OP amplifier; and
    a second OP amplifier coupled to amplify an output voltage of the second voltage divider and output the amplified voltage to a first node of the AGC, wherein the first and second PIN diodes have temperature characteristics substantially identical to corresponding PIN diodes of an automatic gain control (AGC) circuit that is being compensated.

6. The temperature control unit as claimed in claim 5, wherein the AGC circuit comprises a low noise amplifier (LNA) configured to receive and amplify a radio frequency (RF) signal.

7. The temperature control unit as claimed in claim 6, wherein the AGC circuit further comprises an attenuation control unit configured to generate an attenuation control signal by sensing the amplified RF signal.

8. The temperature control unit as claimed in claim 7, wherein the AGC circuit further comprises a PIN diode attenuator configured to attenuate the RF signal inputted to the LNA by driving a first PIN diode with the attenuation control signal.

9. A method of compensating temperature in an automatic gain control (AGC) circuit, comprising:
    dividing a power supply voltage by a first voltage divider;
    amplifying the divided voltage of the first voltage divider to generate a first amplified signal;
    dividing the first amplified signal by a second voltage divider having a first and a second PIN diodes and a resistor; and
    amplifying the divided voltage of the second voltage divider to generate a compensation voltage, wherein the first and second PIN diodes have temperature characteristics substantially identical to corresponding PIN diodes of an automatic gain control (AGC) circuit that is being compensated.

10. The temperature compensating method as claimed in claim 9, further comprising utilizing a low noise amplifier (LNA) to amplify a radio frequency (RF) signal in the AGC circuit.

11. The temperature compensating method as claimed in claim 10, further comprising generating an attenuation control signal by an attenuation control unit that is configured to sense the amplified RF signal in the AGC circuit.

12. The temperature compensating method as claimed in claim 11, further comprising driving a first PIN diode with the attenuation control signal by a PIN diode attenuator configured to attenuate the RF signal inputted to the LNA in the AGC circuit.

13. The temperature compensating method as claimed in claim 9, further comprising applying the compensation voltage to the AGC circuit to compensate for temperature related voltage fluctuations in the AGC circuit.

14. A method of controlling an automatic gain control (AGC) circuit, comprising:

driving a first attenuator circuit with a first control signal so as to attenuate a signal input to the first attenuator circuit;

determining a change in an amount of attenuation of the first attenuator caused by a temperature difference by driving a second attenuator circuit coupled to the first attenuator circuit and having substantially a same temperature characteristic as the first attenuator circuit; and driving the first attenuator circuit with a second control signal in addition to the first control signal to offset the determined change in the amount of attenuation of the first attenuator.

15. The method as claimed in claim 14, wherein the first attenuator circuit includes first and second PIN diodes and the second attenuator circuit includes third and fourth PIN diodes have a same temperature characteristic as the first and second PIN diodes.

16. The method as claimed in claim 14, wherein driving the second attenuator circuit comprises:

dividing a power supply voltage by a first voltage divider;

amplifying the divided voltage of the first voltage divider to generate a first amplified signal;

dividing the first amplified signal by a second voltage divider having a first and a second PIN diodes and a resistor; and amplifying the divided voltage of the second voltage divider to generate a compensation voltage, wherein the first and second PIN diodes have temperature characteristics substantially identical to corresponding PIN diodes of the first attenuator circuit.

17. The method as claimed in claim 14, wherein the second attenuator circuit comprises:

a first voltage divider to divide a power supply voltage;

a first operational (OP) amplifier to amplify the divided voltage of the first voltage divider;

a second voltage divider to divide an output voltage of the first OP amplifier with a PIN diode having a same characteristic as a PIN diode of the first attenuator circuit; and a second OP amplifier to amplify an output of the second voltage divider and output the amplified voltage to the PIN diode attenuator.

18. The method as claimed in claim 17, wherein the second voltage divider comprises two PIN diodes and a resistor coupled in series.

* * * * *